United States Patent [19]
Kuusama et al.

[11] Patent Number: 5,485,524
[45] Date of Patent: Jan. 16, 1996

[54] SYSTEM FOR PROCESSING AN AUDIO SIGNAL SO AS TO REDUCE THE NOISE CONTAINED THEREIN BY MONITORING THE AUDIO SIGNAL CONTENT WITHIN A PLURALITY OF FREQUENCY BANDS

[75] Inventors: Juha Kuusama; Aki Mäkivirta, both of Tampere, Finland

[73] Assignee: Nokia Technology GmbH, Pforzheim, Germany

[21] Appl. No.: 154,848

[22] Filed: Nov. 19, 1993

[30] Foreign Application Priority Data

Nov. 20, 1992 [FI] Finland .................................. 925283

[51] Int. Cl.$^6$ ............................................... H04B 15/00
[52] U.S. Cl. ................................................ 381/94; 381/46
[58] Field of Search ................................. 381/94, 46–47

[56] References Cited

U.S. PATENT DOCUMENTS

| | | | |
|---|---|---|---|
| 3,803,357 | 4/1974 | Sacks | 381/94 |
| 4,882,762 | 11/1989 | Waldhauer | 381/106 |
| 4,896,362 | 1/1990 | Veldhuis et al. | 381/30 |
| 5,067,157 | 11/1991 | Ishida et al. | 381/94 |
| 5,105,463 | 4/1993 | Veldhuis et al. | 381/30 |
| 5,321,758 | 6/1994 | Charpentier et al. | 381/94 |
| 5,337,367 | 8/1994 | Maeda | 381/94 |

*Primary Examiner*—Stephen Brinich
*Attorney, Agent, or Firm*—Ware, Fressola, Van Der Sluys & Adolphson

[57] ABSTRACT

The invention relates to a system for processing an audio signal to reduce the noise contained therein, the system comprising a source (1) of an audio signal in electric form, a first filter group (2) for dividing the audio signal into several subband signals in different frequency bands, a detector (3) for each subband signal to detect the audio signal level thereof, and a compressor/expander (4) for compressing/expanding each subband signal on the basis of the detected audio signal level thereof, and a second filter group (5) for combining the compressed/expanded subband signals to generate a reconstructed audio signal (6). According to the invention the first filter group (2,5) is arranged to divide the sound frequency range into bands with a width enabling the processing of the signal within the critical bands, and each compressor/expander (4) is arranged to attenuate the signal in its band when the detector (3) associated therewith has detected that the audio signal is missing from said frequency band.

2 Claims, 1 Drawing Sheet

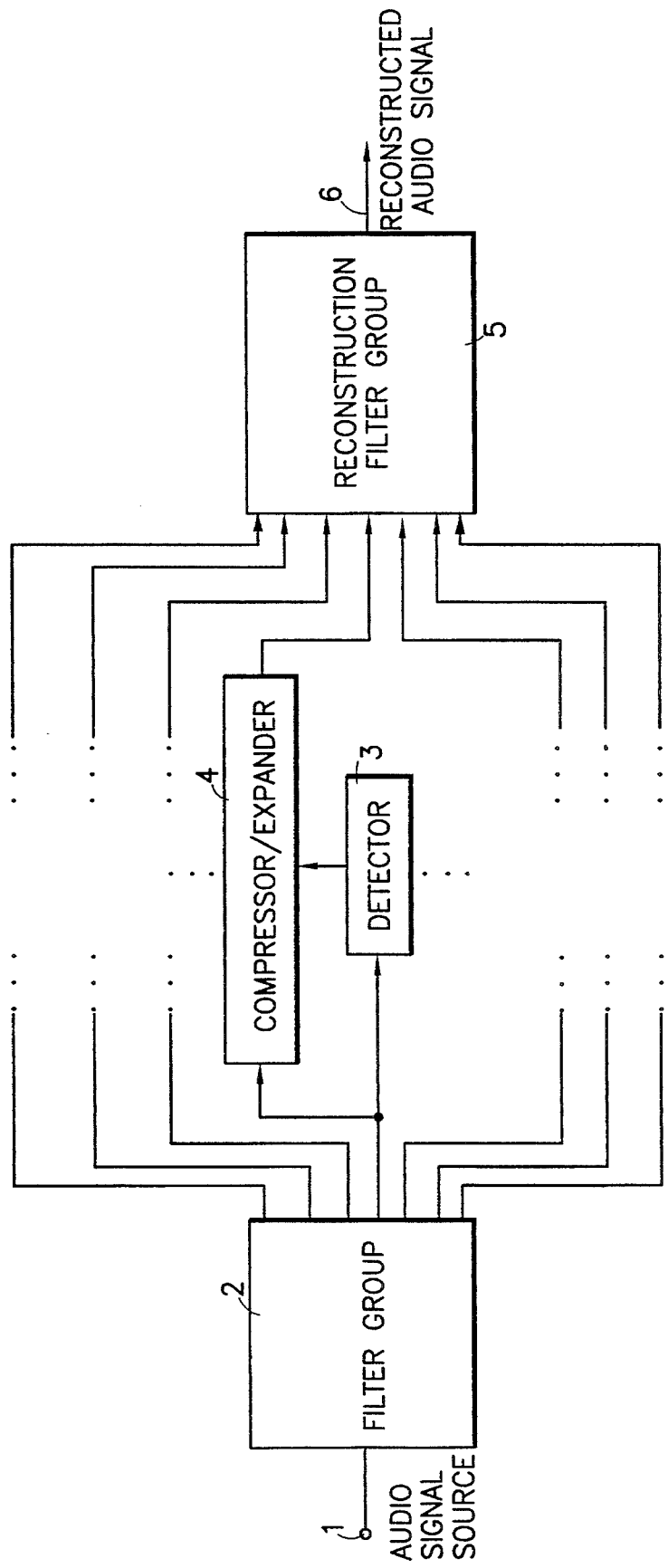

SYSTEM FOR PROCESSING AN AUDIO SIGNAL SO AS TO REDUCE THE NOISE CONTAINED THEREIN BY MONITORING THE AUDIO SIGNAL CONTENT WITHIN A PLURALITY OF FREQUENCY BANDS

TECHNICAL FIELD

The present invention relates to systems for processing an audio signal in order to reduce the noise contained therein.

BACKGROUND OF THE INVENTION

System for processing an audio signal

This invention relates to a system for processing an audio signal to reduce the noise contained therein, the system comprising a source of an audio signal in electric form, a first filter group for dividing the audio signal into several subband signals in different frequency bands, a detector for each subband signal to detect the audio signal level thereof, and a compressor/expander for compressing/expanding each subband signal on the basis of the detected audio signal level thereof, and a second filter group for combining the compressed/expanded subband signals to generate a reconstructed audio signal, whereby the first filter group is arranged to divide the sound frequency range into bands with a width enabling the processing of the signal within the critical bands.

The above system for reducing the noise of an audio signal excluding the use of the critical bands corresponds to what is known as Dolby SR noise attenuation system, in which five independently controllable noise attenuation channels are used to improve the signal to noise ratio separately in five different frequency bands. Thus the reproduction range of the sound reproduction system is divided into five ranges, each of which is processed separately. The basic principle of the Dolby noise attenuation system is to improve the signal to noise ratio such that the lower the level of the audio signal, the more the audio signal is amplified during the recording. This procedure in which the dynamic range of the audio signal is narrowed is called compression. An audio signal compressed in this manner must be expanded upon reproduction, whereby the dynamic range thereof is restored almost to its original range. The advantage of the method is the attenuation of the noise in the transmission link or recording means by about 10 dB. The primary disadvantage of the Dolby system is that the noise can be attenuated by the system only upon reproduction of audio signals that are compressed in accordance with the system concerned. In addition, the division of the frequency bands, if such a division is used, is very rough.

U.S. Pat. Nos. 4,896,362 and 5,105,463 teach a system in which a digital audio signal is split into subbands of approximately critical bandwith in order to make use of the noise-masking curve of the human auditory system by removing the masked portion of the signal. The final aim of the system is to requantize the signal within each subband to a minimum number of bits so that the quatization noise would not be audible. U.S. Pat. No. 4,882,762 discloses a system in which an audio signal is frequency selectively compressed so that the compression ratio is selected independently for each of the frequency bands. These systems are, however, not intended for attenuating background noise present in an audio signal.

SUMMARY OF THE INVENTION

The object of the present invention is to provide a noise attenuation system also suitable for use with audio signals that have not been filtered or processed, e.g. compressed, beforehand. This result is achieved by the system according to the invention, which is characterised in that each compressor/expander is arranged to attenuate the signal in its band when the detector associated therewith has detected that the audio signal is missing from said frequency band.

An essential starting point of the system according to the invention is to divide the audio signal into frequency bands that are so called critical bands or into components thereof, from which components the critical bands can be formed by suitable combinations. The principal properties of the human auditory system, e.g. the masking phenomenon and the property of critical bands associated therewith, are used therein. The masking phenomenon of the human auditory system refers to the ability of a tone to suppress a lower level signal from being recognised and heard in the vicinity of the tone. Broadly speaking, the spectral band where the lower level sounds are being suppressed is called a critical band. A more exact definition for the critical band is the range 10 of frequencies of the noise signal where sounds occur that contribute to the masking of a tone centered in frequency in said band of noise. A masking phenomenon exists also in the time domain. This is referred to as nonsimultaneous masking. A masking signal can then mask a tone occurring before or after the signal itself. The time period for these masking effects is very short, less than 100 ms.

Normal audio signals (speech, music) are not narrow band signals. Therefore their ability to act as a masker is greater than that of a pure tone. When sound power exists in a certain frequency band, it acts as a masker of any noise in that band. This noise may be inherent to the recording or it may be due to unoptimal performance of a sound reproduction system.

When there is no audio signal present in the critical band, into which the frequency band is divided by the filter groups of the system according to the invention, said band can be attenuated without any audible change in the actual signal. The audible change will be that the noise appears to attenuate or disappear. The attenuation rate/time is determined by the pre- or postmasking phenomenon. Because the actual signal content is not changed in the system according to the invention, the attenuation of noise does not lead to any level changes in the actual signal, i.e. there is no associated "pumping effect" in the sound level or the noise level.

BRIEF DESCRIPTION OF THE DRAWING

In the following the system according to the invention is described in greater detail with reference to the attached drawing, wherein the FIGURE shows a principal block diagram of the sound reproduction system according to the invention.

BEST MODE FOR CARRYING OUT THE INVENTION

In the FIGURE, reference number 1 stands for a tone source, which may be any conventional source of an audio signal in electric form, such as a microphone, tuner, tape recorder, CD player or the like. From the audio signal source 1 the audio signal is conducted to a filter group 2, which divides the audio signal into several frequency bands, the frequency bands either corresponding to so called critical bands of the human auditory system or being combinable to form such bands. Each subband signal is conducted to a detector 3, which detects the level of the audio signal in said frequency band and controls, on the basis of this level, a compressor/expander 4, to which said subband signal has also been conducted. Thus, each subband signal has its own detector 3 and compressor/expander 4.

The effect of the controlling of the compressor/expander by the detector 3 on the operation of the compressor/expander can be varied as necessary. For example, under optimum listening conditions it is most advantageous that the detector 3 controls the compressor/expander 4 such that when an audio signal is missing from the frequency band in question, the compressor/expander attenuates the signal of said band from being audible. Thus the noise in the audio signal generated by the audio signal source 1 can be totally removed in said frequency band without any effect on the audio signal itself. If the detector 3 detects the presence of an audio signal in said frequency band, the compressor/expander 4 is controlled such that it does not affect said audio signal in any way.

The signals generated by the compressors/expanders 4 of all critical frequency bands are conducted to a reconstruction filter group 5, which combines them to form a reconstructed audio signal 6. In this situation the reconstructed audio signal 6 no longer contains noise except in the critical frequency bands that also contain audio signals. Since in most cases said audio signal is capable of covering the noise occurring at the same frequency, the reconstructed audio signal appears to be almost noiseless. In this connection it should be remembered that the audio signal of even the most modern audio signal sources, such as a CD player, may contain a fair amount of noise if the recording from which said CD has been compressed has contained a fair amount of noise. This is naturally the case particularly with older recordings.

Under listening conditions that are not optimum, e.g. in a vehicle, the sound reproduction system according to the invention can also be applied such that the compressors/expanders 4 are arranged to compress the audio signal when the audio signal level is low. This naturally leads to distortion of the dynamics of the audio signal although it improves the overall effect which can be achieved in noisy conditions, e.g. in a vehicle, since even the low frequency signals can then be made audible.

The operations described above may also be used in combination such that the critical bands that contain an audio signal are compressed and the critical bands that do not contain an audio signal are attenuated to remove the noise in these bands. Thus, by the system according to the invention it is possible to remove noise generated in a sound reproduction system and also noise inherent in the recording itself. Noise can also be removed despite the fact that the dynamic range of the audio signal is compressed.

The system according to the invention for processing an audio signal is described only by way of one exemplary embodiment and it is to be understood that the blocks of the invention can be realised by means of apparatus solutions very different from one another without deviating from the scope defined by the attached claims. For example, the detector detecting the level of the audio signal in said critical band or the absence of the signal can be realised in many different ways, some of which have been applied in the known noise attenuation systems.

We claim:

1. A system for processing an audio signal to reduce the noise contained therein, the system comprising a source (1) of an audio signal in electric form, a first filter group (2) for dividing the audio signal into several subband signals in different frequency bands, a detector (3) for each subband signal to detect the audio signal level thereof, and a compressor/expander (4) for compressing/expanding each subband signal on the basis of the detected audio signal level thereof, and a second filter group (5) for combining the compressed/expanded subband signals to generate a reconstructed audio signal (6), wherein the first filter group (2) is arranged to divide the sound frequency range into critical bands, each critical band having a maximum width so as to enable the processing of the signal within each critical band, and wherein the second filter group (5) is arranged to combine the sound in the bands to generate the reconstructed audio signal (6), characterised in that each compressor/expander (4) is arranged to attenuate the signal in its band when the detector (3) associated therewith has detected that the audio signal is missing from said frequency band.

2. A system according to claim 1, characterised in that each compressor/expander (4) is arranged to compress the audio signal in its band when the detected level of said signal is low.

* * * * *